United States Patent
Chun et al.

(10) Patent No.: US 7,285,485 B2
(45) Date of Patent: Oct. 23, 2007

(54) METHOD FOR FORMING A GATE IN A SEMICONDUCTOR, WHICH PREVENTS GATE LEANING CAUSED BY THERMAL PROCESSING

(75) Inventors: Yun Seok Chun, Seoul (KR); Hyung Bok Choi, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 11 days.

(21) Appl. No.: 11/156,287

(22) Filed: Jun. 17, 2005

(65) Prior Publication Data

US 2006/0211186 A1 Sep. 21, 2006

(30) Foreign Application Priority Data

Mar. 15, 2005 (KR) .................. 10-2005-0021390

(51) Int. Cl.
*H01L 21/4763* (2006.01)
(52) U.S. Cl. ............... 438/589; 438/486; 438/592; 438/655; 438/664
(58) Field of Classification Search ........... 438/242, 438/486, 589, 592, 655, 664
See application file for complete search history.

(56) References Cited

U.S. PATENT DOCUMENTS 6,017,819 A * 1/2000 Brigham et al. ............ 438/592
6,284,635 B1 * 9/2001 Jang ........................... 438/592
2001/0036728 A1 * 11/2001 Shinmura ................... 438/660
2005/0173759 A1 * 8/2005 Kim et al. ................... 257/331
2007/0117294 A1 * 5/2007 Kim
2007/0117364 A1 * 5/2007 Kim

FOREIGN PATENT DOCUMENTS

| JP | 04-105324 A | * | 4/1992 |
| JP | 07078981 A | * | 3/1995 |
| KR | 2001003341 A | * | 1/2001 |
| KR | 1020040108247 A | | 12/2004 |

OTHER PUBLICATIONS

Wolf et al., Stanley, "Crystalline Defects, Thermal Processing, and Gettering," Silicon Processing for the VLSI Era—vol. 1: Process Technolgy, Lattice Press (1986), pp. 56-58.*

* cited by examiner

*Primary Examiner*—Zandra V. Smith
*Assistant Examiner*—Toniae M Thomas
(74) *Attorney, Agent, or Firm*—Ladas & Parry LLP

(57) ABSTRACT

A method for forming a gate in a semiconductor device includes the steps of: providing a substrate having active and field regions; selectively etching a portion of the active region to form a trench; forming on the substrate including the trench an amorphous conductive film for forming a gate; subjecting the resulting structure to an annealing process so as to convert the amorphous conductive film into a crystalline conductive film; and selectively etching the crystalline conductive film so as to form a gate covering the corner portion of the trench.

10 Claims, 6 Drawing Sheets

FIELD REGION | ACTIVE REGION | FIELD REGION

FIELD REGION | ACTIVE REGION | FIELD REGION

FIELD REGION | ACTIVE REGION | FIELD REGION

FIELD REGION | ACTIVE REGION | FIELD REGION

METHOD FOR FORMING A GATE IN A SEMICONDUCTOR, WHICH PREVENTS GATE LEANING CAUSED BY THERMAL PROCESSING

BACKGROUND OF THE INVENTION

1. Field of the Invention

The present invention relates to a method for manufacturing a semiconductor device, and more particularly, to a method for forming a gate in a semiconductor device, which can improve the characteristics of the device.

2. Description of the Prior Art

Currently, as the size of a semiconductor device becomes smaller, it is more and more difficult to secure the capacity of a capacitor. Also, as the magnitude of electric field in the junction regions of a transistor becomes larger, it is more and more difficult to secure the refresh characteristics of a cell area. For this reason, a method is used which makes the effective channel length of a transistor by the use of a three-dimensional cell other than a planar cell.

Particularly, a structure was recently proposed in which the capacitor contact region of a substrate is placed lower than the bit-line contact region by forming the gate after recessing a portion of the edge region of the active region of the substrate, and thus, the effective channel length required for the operation of the gate is increased. This structure shows an increase in the threshold voltage by an increase in channel length, thus an improvement in the refresh characteristics.

FIGS. 1A to 1E are cross-sectional views for explaining a method for forming a gate in a semiconductor device according to the prior art.

As shown in FIG. 1A, the silicon substrate 10 having active and field regions is provided, and then, the isolation film 11 is formed on the field region of the substrate 10. Next, on the silicon substrate 10 including the isolation film 11, the first photoresist pattern 12 exposing the edge portion of the active region is formed.

As shown in FIG. 1B, the silicon substrate 10 is then etched using the first photoresist pattern 12 as an etch barrier so as to form the trench 13. Following this, the first photoresist pattern 12 is removed.

As shown in FIG. 1C, the gate oxide film 14, the silicon film 15, the tungsten silicide film 16 and the hard mask film 17 are sequentially formed on the resulting structure. At this time, the thickness of a portion on the trench 13, i.e., the thickness of a portion of the silicon film 15 formed on the etched portion of the substrate 10, is larger than the thickness of a portion of the silicon film 15 formed on the unetched portion of the substrate 10. Then, the second photoresist pattern 18 defining a gate formation region is formed on the hard mask film.

As shown in FIG. 1D, the hard mask film 17, the tungsten silicide film 16, the silicon film 15 and the gate oxide film 14 are selectively etched using the second photoresist pattern 18 as an etch barrier so as to form the gate 19 covering the corner portion of the trench 13. Then, the second photoresist pattern 18 is removed. In FIG. 1D, reference numerals 14a, 15a, 16a and 17a designate the gate oxide film remaining after the etching, the silicon film remaining after the etching, the tungsten silicide film remaining after the etching, and the hard mask film remaining after the etching, respectively.

Thereafter, in order to recover from damage caused by the etching step for forming the gate 19, the silicon substrate 10 including the gate 19 is subjected to the thermal oxidation process 20.

As shown in FIG. 1E, an insulating film (not shown) for forming gate spacers is then formed on the resulting structure by a thermal process. Next, the gate spacer-forming insulating film is etched to form the gate spacers 21 on both sidewalls of the gate 19.

FIG. 2 is a cross-sectional view showing problems occurring in the prior art.

In the method for forming the gate in the semiconductor device according to the prior art, however, the volume of the silicon film 15a and the tungsten silicide film 16a shrinks in the thermal oxidation process 20 and the thermal process for forming the spacers 21. Also, since the thickness of a portion of the silicon film 15a and the tungsten silicide film 16a placed on the trench is greater than the thickness of a portion of the silicon film 15a and the tungsten silicide film 16a placed on the unetched portion of the substrate, the volume of a portion of the silicon film 15a and the tungsten silicide film 16a placed on the trench 13 relatively greatly shrinks. Thus, as shown in FIG. 2, the gates 20 lean to the trench 13 (see arrow). Due to the leaning of the gates 20, the interval between the gates 20 becomes narrow, and thus, contact open failure in the formation of a landing plug contact will occur. Also, an interlayer insulating film to be formed subsequently does not completely fill the space between the gates 20, so that a bridge between plugs can occur. As a result, the characteristics of the device will be deteriorated.

SUMMARY OF THE INVENTION

Accordingly, the present invention has been made to Solve the above-mentioned problems occurring in the prior art, and it is an object of the present invention to provide a method for forming a gate in a semiconductor device, which can prevent the gate from leaning due to the right and left asymmetry of the volumes of the silicon film and the tungsten silicide film, thus improving the characteristics of the device.

To achieve the above object, in one embodiment, the present invention provides a method for forming a gate in a semiconductor device, the method comprising the steps of: providing a substrate having active and field regions; selectively etching a portion of the active region to form a trench; forming on the substrate including the trench an amorphous conductive film for forming a gate; annealing the resulting structure so as to convert the amorphous conductive film into a crystalline conductive film; and selectively etching the crystalline conductive film so as to form a gate covering the corner portion of the trench.

In the inventive method, the trench is preferably formed on a capacitor contact or bit line contact region.

Also, the depth of the trench is preferably 300-600 Å.

Also, the gate-forming amorphous conductive film is preferably formed by sequentially depositing an amorphous silicon film and an amorphous metal silicide film.

Also, the amorphous silicon film is a phosphorus-doped amorphous film.

Also, the amorphous silicon film is preferably formed at a temperature of 510-550° C. to a thickness of 600-1,000 Å.

Also, the amorphous metal silicide film is preferably any one selected from the group consisting of an amorphous tungsten silicide film, an amorphous cobalt silicide film, and an amorphous titanium silicide film.

Also, the amorphous metal silicide film preferably has a thickness of 800-1,300 Å.

Also, the annealing step is preferably performed in an atmosphere of $N_2$.

Also, the annealing step is preferably performed with furnace equipment at a temperature of 700-900° C. for 20-60 minutes.

In addition, the annealing step is preferably performed with RTP equipment at a temperature of 800-1,000° C. for 10-60 seconds.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENT

Hereinafter, a preferred embodiment of the present invention will be described in detail with reference to the accompanying drawings.

FIGS. 3A to 3F are cross-sectional views for explaining each step of a method for forming a gate in a semiconductor device according to the present invention.

Figure 1A:
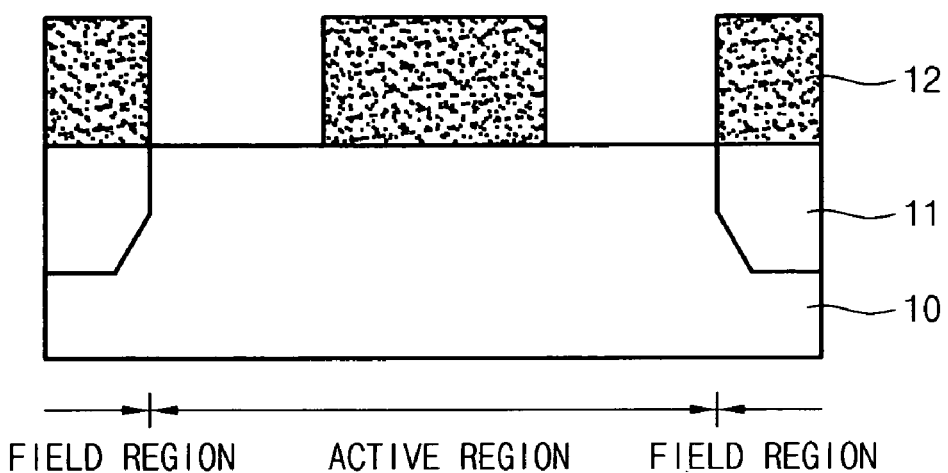
FIGS. 1A to 1E are cross-sectional views for explaining each step of a method for forming a gate in a semiconductor device according to the prior art.
Figure 1B:
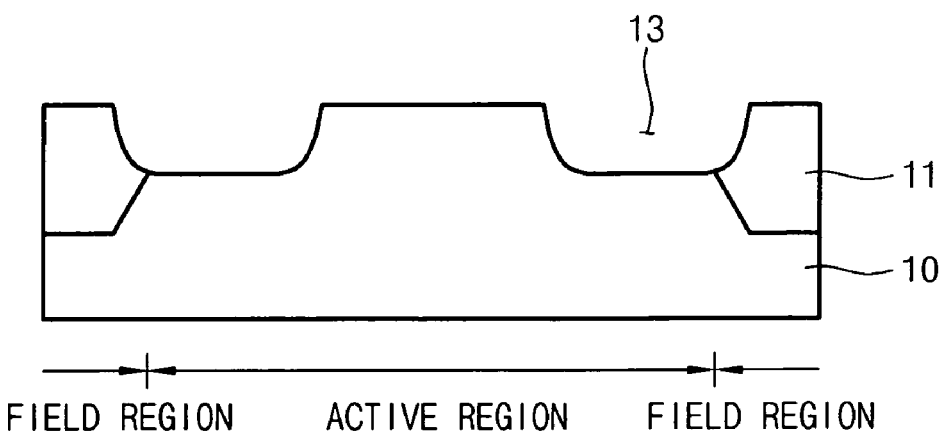
Figure 1C:
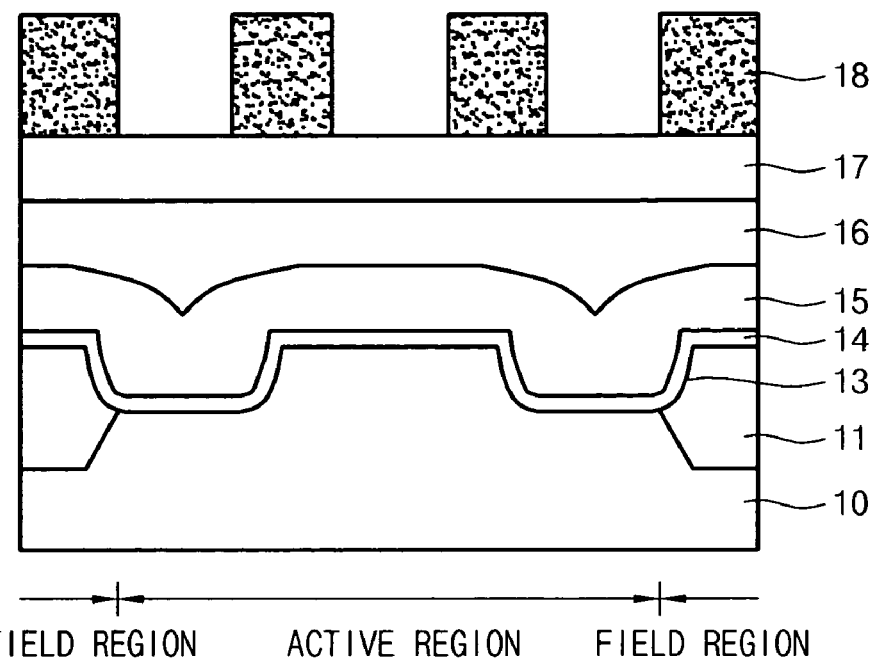
Figure 1D:
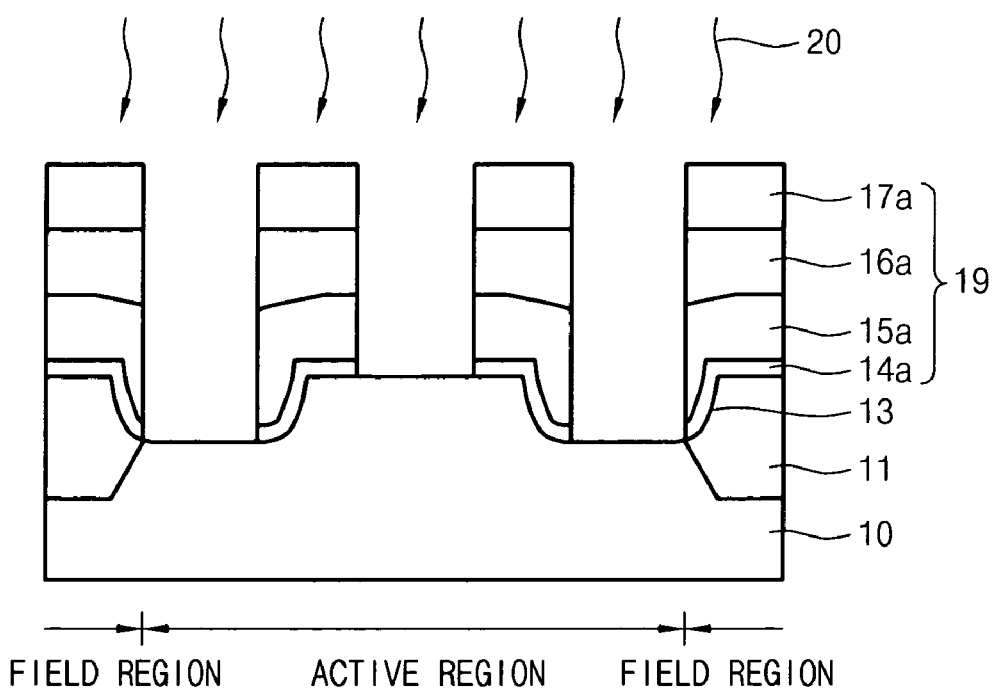
Figure 1E:
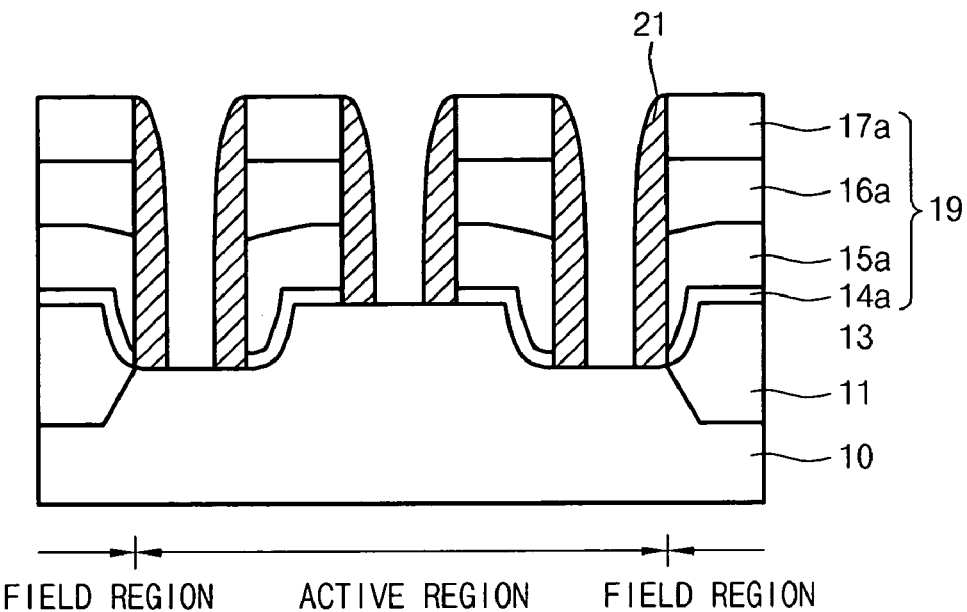
Figure 2:
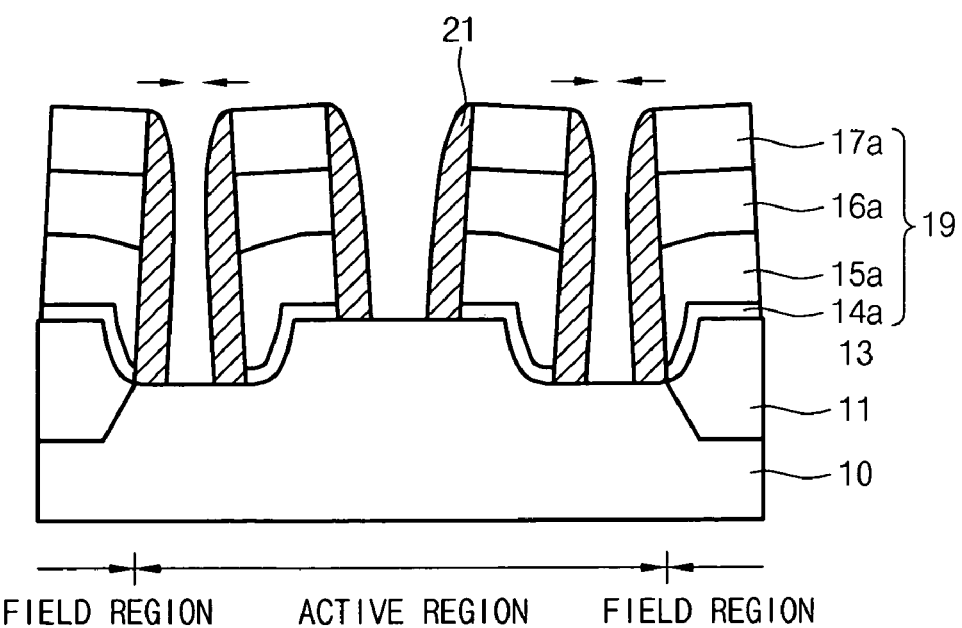
FIG. 2 is a cross-sectional view showing problems occurring in the prior art.
Figure 3A:
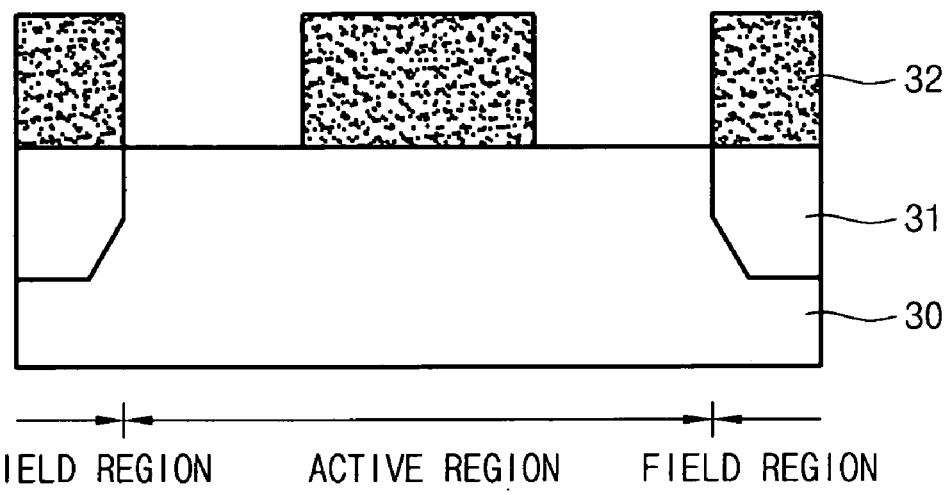
FIGS. 3A to 3F are cross-sectional views for explaining each step of a method for forming a gate in a semiconductor device according to the present invention.

As shown in FIG. 3A, the silicon substrate 30 having active and field regions is provided. Then, the isolation film 31 is formed on the field region of the substrate 30. Next, on the silicon substrate 30 including the isolation film 31, the first photoresist pattern 32 is formed which exposes the edge portion of the active region.

Figure 3B:
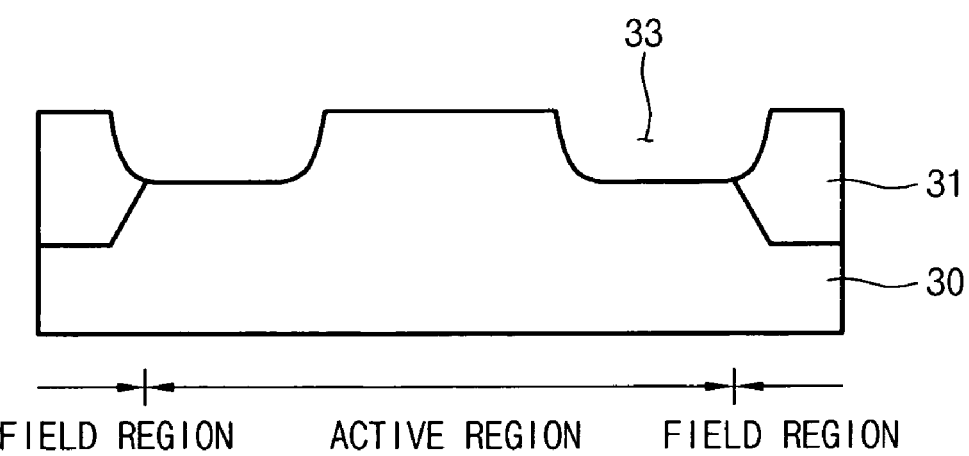

As shown in FIG. 3B, the substrate 30 is then etched using the first photoresist pattern 32 as an etch barrier so as to form the trench 33. The trench 33 is formed to a depth of 300-600 Å, and preferably 400 Å. This trench 33 is formed at a capacitor contact portion to be formed later. Thereafter, the first photoresist pattern 32 is removed.

Meanwhile, although not shown in the drawings, the trench 33 may also be formed at the central portion of the active region of the substrate 30, i.e., a bit line contact portion to be formed later, instead of being formed at the edge of the active region of the substrate 30.

Thereafter, in order to recover damage caused by the etching process for forming the trench 33, the resulting substrate is subjected to an oxidation process so as to form a sacrificial oxide film (not shown). Then, the sacrificial oxide film is removed with an HF solution.

Figure 3C:
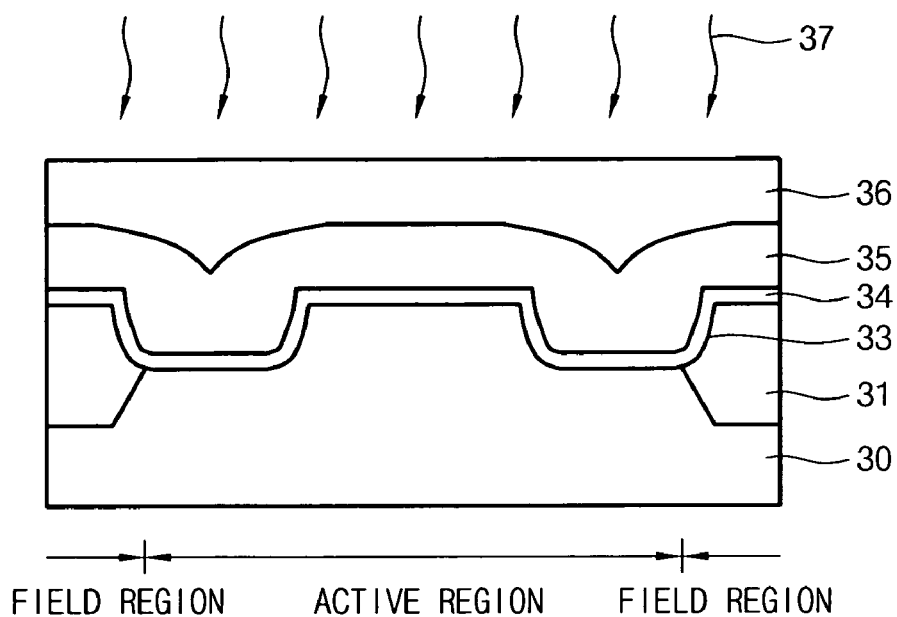

As shown in FIG. 3C, on the resulting structure, the gate oxide film 34 is formed. The gate oxide film 34 is formed with furnace equipment by a wet oxidation or dry oxidation process at a temperature of 750-900° C. to a thickness of 25-60 Å, and preferably at a temperature of 800° C. to a thickness of 35 Å. Although not shown in the drawings, the gate oxide film 34 may also be formed as a dual gate oxide film by forming an oxide film and then subjecting the oxide film to a reoxidation process.

Subsequently, an amorphous conductive film for forming a gate, which consists of a sequential deposition of the amorphous silicon film 35 and the amorphous metal silicide film (e.g., amorphous tungsten silicide film) 36, is formed on the gate oxide film 34. The amorphous silicon film 35 is preferably a phosphorus-doped silicon film. This amorphous silicon film 35 is formed at a temperature of 510-550° C. to a thickness of 600-1,000 Å, and preferably at a temperature of 510-550° C. to a thickness of 600-1,000 Å. The amorphous metal silicide film 36 is preferably selected from the group consisting of an amorphous tungsten silicide film, an amorphous cobalt silicide film, and amorphous titanium silicide film. The amorphous metal silicide film is formed to a thickness of 800-1,300 Å, and preferably of 1,000 Å.

Thereafter, the resulting structure is subjected to the annealing process 37, so that the amorphous silicon film 35 and the amorphous tungsten silicide film 36, which form the amorphous conductive film for forming the gate, are converted into the crystalline silicon film 35 and the crystalline tungsten silicide film 36, respectively. The annealing process 37 is performed in an atmosphere of $N_2$. Also, the annealing process is performed with furnace equipment at a temperature of 700-900° C. for 20-60 minutes, and preferably at a temperature of 850° C. for 30 minutes. The annealing process 37 may also be performed with RTP (rapid thermal processing) equipment, in which case it is performed at a temperature of 800-1000° C. for 10-60 seconds, and preferably at a temperature of 900° C. for 30 seconds.

As the annealing process 37 progresses, the amorphous silicon film 35 and the amorphous silicide film 36 are crystallized while their volume shrinks. This volume shrinkage phenomenon appears throughout the entire region of the substrate 30, and thus, only the thickness of the amorphous conductive film for forming the gate is simply reduced.

Figure 3D:
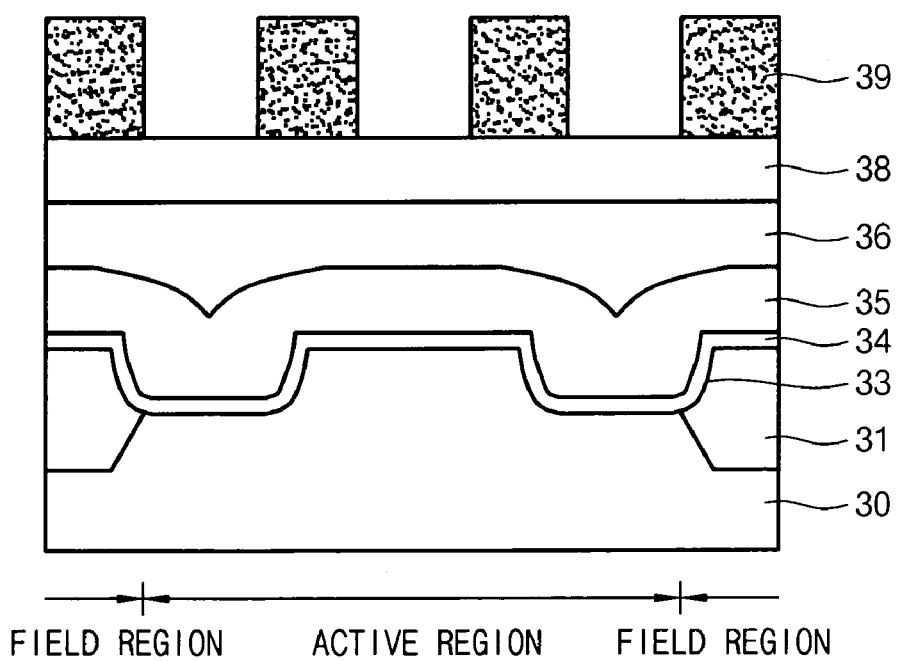

As shown in FIG. 3D, the gate-forming hard mask film 38 and the second photoresist pattern 39 defining a gate formation region are then sequentially formed on the crystalline tungsten silicide film 36.

Figure 3E:
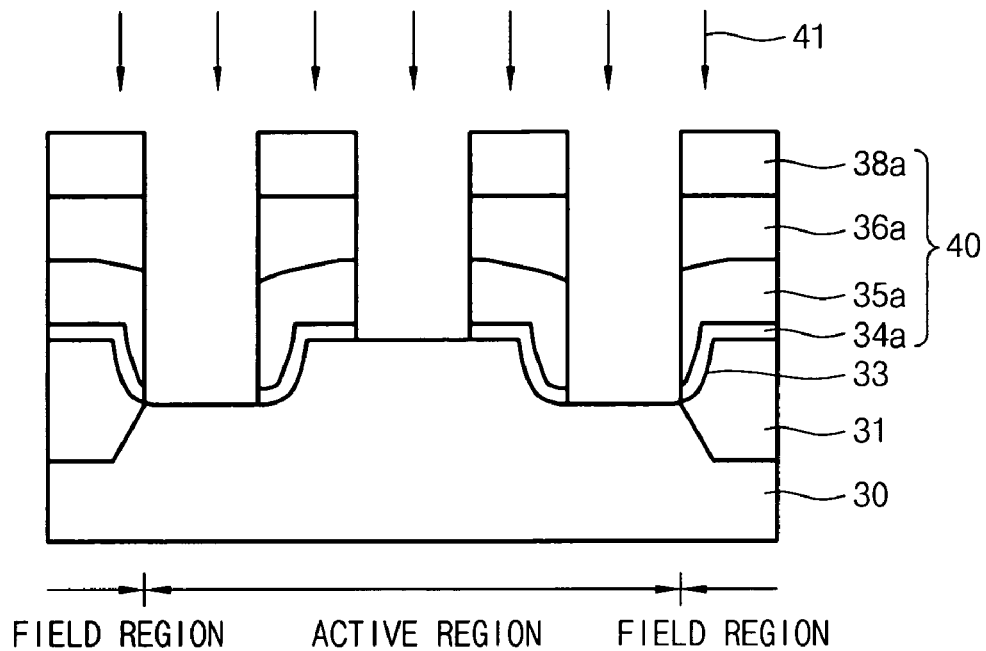

As shown in FIG. 3E, the gate-forming hard mask film 38, the crystalline tungsten silicide film 36, the crystalline silicon film 35 and the gate oxide film 34 are Selectively etched using the second photoresist pattern 39 as an etch barrier so as to form the gate 40 covering the corner portion of the trench 33. In FIG. 3E, reference numerals 34a, 35a, 36a and 38a designate the gate oxide film remaining after the etching, the crystalline silicon film remaining after the etching, the crystalline tungsten silicide film remaining after the etching, and the hard mask film remaining after the etching, respectively.

Thereafter, in order to recover damage caused by the etching process for forming the gate 40, the silicon substrate 40 including the gate 30 is subjected to the thermal oxidation process 41.

Figure 3F:
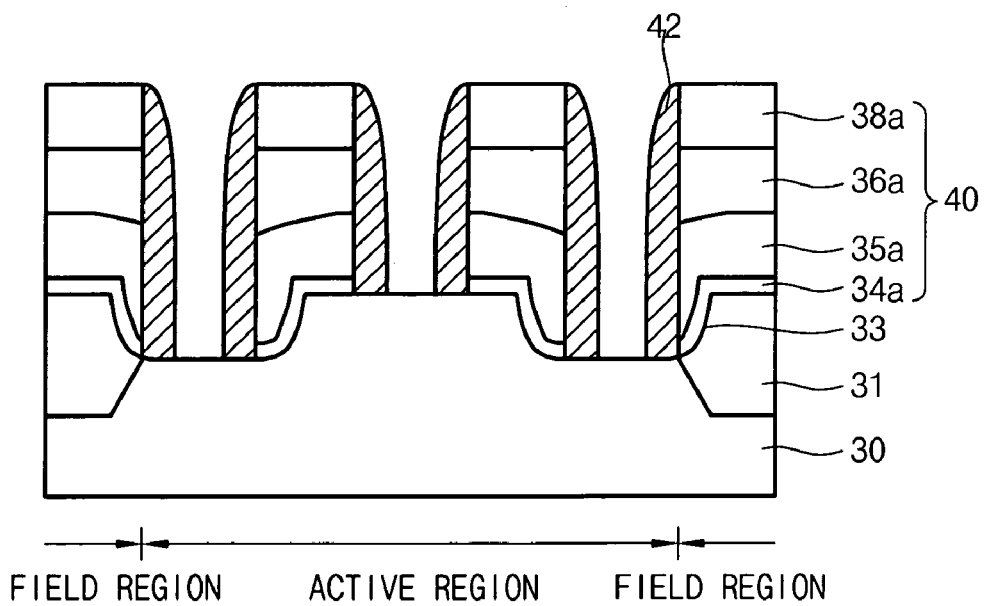

As shown in FIG. 3F, an insulating film (not shown) for forming gate spacers is then formed on the resulting substrate by a thermal process. Then, the gate spacer-forming insulating film is etched to form the gate spacers 42 on both sidewalls of the gate 40. In this case, since the volume of the amorphous silicon film 35 and the amorphous tungsten silicide film 36 already shrinks before the gate 40 is formed, the volume shrinkage of the crystalline silicon film 35a and the crystalline tungsten silicide film 36a, which is caused by the thermal oxidation process 41 conducted after the formation of the gate 40 and the thermal process for forming the gate spacers 42, can be minimized. For this reason, even though the right and left volumes of the crystalline silicon film 35a and the crystalline tungsten silicide film 36a in the gate 40 are asymmetric, the gate 40 can be prevented from leaning by the thermal oxidation process 41 and the thermal process for forming the gate spacers 42. Thus, contact open failure in the subsequent formation of a landing plug contact can be prevented from occurring, and the filling characteristics of an interlayer insulating film that will fill the space between the gates 40 can be prevented from deteriorating.

As can be seen from the foregoing, according to the present invention, the process for forming the gate is performed after forming the amorphous silicon film and amorphous tungsten silicide film for gates on the substrate having the trench formed at a portion of the active region and then annealing the resulting structure so as to achieve the crystallization and volume shrinkage of the amorphous silicon film and the amorphous silicide film. Thus, it is possible to minimize the volume shrinkage of the crystalline silicon film and the crystalline tungsten silicide film, which is caused by the thermal oxidation process conducted after the formation of the gate and the thermal process for forming the gate spacers. Accordingly, the gate can be prevented from leaning due to the right and left asymmetry of the volume of the silicon film and tungsten silicide film forming the gate, thus improving the characteristics of the device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a gate in a semiconductor device, the method comprising the steps of:
   providing a substrate having active and field regions;
   selectively etching a portion of the active region to form a trench;
   forming on the substrate including the trench an amorphous conductive film for forming a gate, wherein the amorphous conductive film for forming the gate is formed by sequentially depositing an amorphous silicon film and an amorphous metal silicide film;
   subjecting the resulting structure to an annealing process so as to convert the amorphous conductive film into a crystalline conductive film; and
   selectively etching the crystalline conductive film so as to form a gate covering the corner portion of the trench.

2. The method of claim 1, wherein the trench is formed on a capacitor contact or bit line contact region.

3. The method of claim 1, wherein the depth of the trench is 300-600 Å.

4. The method of claim 1, wherein the amorphous silicon film is a phosphorus-doped amorphous film.

5. The method of claim 1, wherein the amorphous silicon film is formed at a temperature of 510-550° C. to a thickness of 600-1,000 Å.

6. The method of claim 1, wherein the amorphous metal silicide film is any one selected from the group consisting of an amorphous tungsten silicide film, an amorphous cobalt silicide film, and an amorphous titanium silicide film.

7. The method of claim 1, wherein the amorphous metal silicide film has a thickness of 800-1,300 Å.

8. The method of claim 1, wherein the annealing step is performed in an atmosphere of $N_2$.

9. The method of claim 1, wherein the annealing step is performed with furnace equipment at a temperature of 700-900° C. for 20-60 minutes.

10. The method of claim 1, wherein the annealing step is performed with RTP equipment at a temperature of 800-1,000° C. for 10-60 seconds.

* * * * *